United States Patent
Griesau et al.

(10) Patent No.: US 7,046,185 B2
(45) Date of Patent: May 16, 2006

(54) PROGRAMMABLE UNIVERSAL REMOTE CONTROL UNIT AND METHOD OF PROGRAMMING SAME

(75) Inventors: Eugene W. Griesau, Albany, NY (US); David Gustafson, Gilbert, AZ (US)

(73) Assignee: Contec Corporation, Schenectady, NY (US)

( * ) Notice: Subject to any disclaimer, the term of this patent is extended or adjusted under 35 U.S.C. 154(b) by 517 days.

(21) Appl. No.: 10/465,147

(22) Filed: Jun. 19, 2003

(65) Prior Publication Data

US 2004/0257239 A1 Dec. 23, 2004

(51) Int. Cl.
*G08C 19/00* (2006.01)

(52) U.S. Cl. ............ 341/176; 340/825.69; 340/825.72

(58) Field of Classification Search ................ 341/173, 341/176; 340/825.69, 825.72; 348/734
See application file for complete search history.

(56) References Cited

U.S. PATENT DOCUMENTS

| | | | |
|---|---|---|---|
| 4,251,812 A | 2/1981 | Okada et al. | |
| 4,774,511 A | 9/1988 | Rumbolt et al. | |
| 4,825,200 A | 4/1989 | Evans et al. | |
| 4,856,081 A | 8/1989 | Smith | |
| 4,866,434 A | 9/1989 | Keenan | |
| 4,999,622 A | 3/1991 | Amano et al. | |
| 5,020,139 A | 5/1991 | Keenan | |
| 5,081,534 A * | 1/1992 | Geiger et al. | 348/734 |
| 5,187,469 A | 2/1993 | Evans et al. | |
| 5,307,173 A | 4/1994 | Yuen et al. | |
| 5,317,403 A | 5/1994 | Keenan | |
| 5,410,326 A * | 4/1995 | Goldstein | 348/734 |
| 5,414,426 A | 5/1995 | O'Donnell et al. | |
| 5,451,953 A | 9/1995 | Duffield | |
| 5,608,389 A | 3/1997 | Matsuzawa | |
| 5,822,123 A * | 10/1998 | Davis et al. | 725/43 |
| RE35,954 E | 11/1998 | Levine | |
| 5,894,276 A | 4/1999 | Altidor et al. | |
| 5,959,751 A | 9/1999 | Darbee et al. | |
| 5,969,774 A | 10/1999 | Wininger | |
| 5,987,213 A | 11/1999 | Mankovitz et al. | |
| 6,055,244 A * | 4/2000 | Wall et al. | 370/487 |
| 6,094,239 A | 7/2000 | Weber | |
| 6,107,951 A | 8/2000 | Katayama et al. | |
| 6,127,961 A | 10/2000 | Stacy et al. | |
| 6,130,625 A | 10/2000 | Harvey | |
| 6,157,319 A | 12/2000 | Johns et al. | |
| 6,236,350 B1 | 5/2001 | Andrews | |
| 6,292,230 B1 | 9/2001 | Shui et al. | |

(Continued)

OTHER PUBLICATIONS

Daniel Tonks, "Remote Control Review", pp. 1-2, 1998-2002; "Remote Control Programming Instructions", pp. 1-2, 1998-2002.

(Continued)

*Primary Examiner*—Albert K. Wong
(74) *Attorney, Agent, or Firm*—Frishauf, Holtz, Goodman & Chick, P.C.; Robert P. Michal

(57) ABSTRACT

A universal remote control unit stores signal formatting data which includes an indication of the category of device to which the signal formatting data corresponds. During programming of the universal remote control unit, the user provides a numerical entry which corresponds to the signal formatting data stored in the memory. The universal remote control unit automatically stores the code entered by the user at the appropriate memory location corresponding to the category of device by analyzing the signal format data to which the code corresponds.

24 Claims, 12 Drawing Sheets

U.S. PATENT DOCUMENTS

| | | |
|---|---|---|
| 6,346,934 B1 | 2/2002 | Wugofski |
| 6,650,248 B1 * | 11/2003 | O'Donnell et al. .... 340/825.69 |
| 2001/0010503 A1 | 8/2001 | Darbee et al. |
| 2001/0024566 A1 | 9/2001 | Mankovitz |
| 2002/0024517 A1 | 2/2002 | Kwon |
| 2002/0053981 A1 | 5/2002 | Van Ryzin |

OTHER PUBLICATIONS

Ralph Calabria, Product Review—Marantz RC-2000 Learning Remote Control, Jun., 1997; pp. 1-2; Secrets of Home Theater & High Fidelity.

* cited by examiner

| Record Length |
| --- |
| Protocol Type |
| MANUFACTURER NAME |
| Device Type |
| On |
| Off |
| 0 - 9 |
| Ch + |
| CH - |
| Vol + |
| Vol - |
| Mute |
| ⋮ |
| End Of Record |

FIG. 3

| Record Length |
| --- |
| Protocol Type |
| MANUFACTURER NAME |
| Device Type |
| Alternate Device Type |
| On |
| Off |
| 0 - 9 |
| Ch + |
| CH - |
| Vol + |
| Vol - |
| Mute |

...

| End Of Record |
| --- |

FIG. 11

PROGRAMMABLE UNIVERSAL REMOTE CONTROL UNIT AND METHOD OF PROGRAMMING SAME

FIELD OF THE INVENTION

The present invention relates generally to a remote control unit for remotely controlling a plurality of devices in which signal formatting data is stored in the remote control unit, and to a method of programming a remote control unit to control the plurality of devices.

BACKGROUND INFORMATION

Remote control units have gained widespread popularity for use in remotely controlling home entertainment systems, which typically include devices such as televisions, cable set-top boxes or converters, videocassette recorders (VCR), digital video disk (DVD) players/recorders and stereos. Typically each device includes a separate remote control unit, which is provided by the manufacturer of the device, for remotely controlling the specific device. This causes the home entertainment system user to have many remote control units. This is very cumbersome and may lead to confusion for the user.

In order to eliminate the need for multiple remote control units, universal remote control units have been developed. The universal remote control unit has a plurality of operating modes for controlling a plurality of devices. Each operating mode enables the user to remotely control a corresponding device. Typically, the universal remote control unit includes a plurality of mode push buttons (e.g., CABLE, TV, and VCR push buttons) which correspond to the different devices to be controlled. The mode push buttons are used to directly change the operating mode of a corresponding device. In order for the universal remote control unit to operate each of the different devices, the remote control unit must be programmed to send a signal which is recognized only by the selected device, to obtain an appropriate response from the device.

Typically, universal remote control units include a memory that stores signal formatting data of different manufacturers which identify the signal structure to which specific manufacturer and model number devices are responsive. These signal formatting data commonly vary based on the device which is to be controlled. Programming the universal remote control unit involves identifying the signal formatting data that is stored in the memory to which the device to be controlled is responsive.

Traditional methods for programming a universal remote control unit which have the afore-mentioned signal formatting data previously stored in memory involve selecting a specific category (e.g., television, cable set-top box or converter, video device or audio device) with which the remote control unit is to be programmed to operate, and then identifying the signal formatting data which is to be associated with the selected category. U.S. Pat. No. 5,872,562 (McConnell et al) teach one such programming method. In McConnell et al the user first activates an entry initiate key and then selects a key on the remote control unit signifying a particular category of device to be controlled. Thereafter, the user enters a code indicative of an address in the memory which stores the specific signal formatting data. This data is read out and applied to a microprocessor which, in turn, controls the transmission of signals which are formatted to operate the selected device. An association between the stored signal formatting data and the category of device to be controlled is stored in the universal remote control unit. The method is repeated for each device which is to be controlled by the remote control unit.

While U.S. Pat. No. 5,872,562 is a usable method, there is a desire to develop alternate simplified methods for programming universal remote control units which do not require the user to select a device category during programming.

SUMMARY OF THE INVENTION

It is therefore an object of the present invention to provide a universal remote control unit having signal formatting data stored therein and a method of programming the universal remote control unit which does not require user actuation of a category select button during programming and which is capable of concurrently controlling a plurality of devices.

In accordance with one form of the present invention, a method of programming a universal remote control unit includes the steps of initiating, by a user, a programming mode; entering, by a user, characters corresponding to at least a portion of the name of the manufacturer of a device to be controlled by the remote control unit; identifying from the characters, a signal formatting data entry, which includes signal formatting data, stored in a memory device in the remote control unit, which signal formatting data includes data determinative of a device type; and associating a device type in the remote control unit with the signal formatting data entry based upon the device type data, such that when one or more of a device type key associated with a device type is subsequently depressed, subsequent commands sent by the remote control unit have the format specified by the signal formatting data, and when a command key uniquely associated with the device type is depressed, commands sent by the remote control unit have the format specified by the signal formatting data.

In accordance with another form of the present invention, a method of programming a universal control unit includes the steps initiating, by a user, a programming mode; entering, by a user, characters corresponding to at least a portion of the name of the manufacturer of a device to be controlled by the remote control unit; identifying, from the characters, a signal formatting data entry, which includes signal formatting data, stored in a memory device in the remote control unit, which signal formatting data includes data determinative of a device type; and associating a device type in the remote control unit with the signal formatting data entry based upon the device type data.

In accordance with yet another form of the present invention, a universal remote control unit for remotely controlling a plurality of devices, each having at least one of a plurality of types, includes a memory; a plurality of signal formatting data entries stored at respective locations in the memory, each entry comprising type information identifying a type of device, a manufacturer, and signal format information specifying signal formats of commands for controlling at least one of the plurality of devices of that type; a transmitter; input means; and a processor capable of accessing the signal formatting data entries in the memory and capable of controlling the transmitter to transmit signals in conformance with the signal format information in the signal formatting data entries in response to actuation of the input means.

The above and other objects, features and advantages of the present invention will become readily apparent from the following detailed description thereof, which is to be read in connection with the accompanying drawings.

BRIEF DESCRIPTION OF THE DRAWINGS

FIG. 3 is a diagram showing the contents of one signal formatting data entry for controlling a televison, which includes the manufacturer's name and device type, stored in the memory of the remote control unit;

FIG. 11 is a diagram showing an alternative embodiment of the contents of one signal formatting data entry for controlling a televison, which includes an alternative device type stored in the memory of the remote control unit.

DETAILED DESCRIPTION OF THE PREFERRED EMBODIMENT

The present invention is directed to a method for programming a remote control unit and a device which performs the function of remotely controlling a plurality of devices. Specifically, the method is used in conjunction with universal remote control units which transmit signals to remotely control a plurality of devices of different category types. Typically many different signal formats are required to control the different devices. All of the signals formats for the different devices are stored in a memory at respective memory locations (explained in more detail below).

Figure 1:
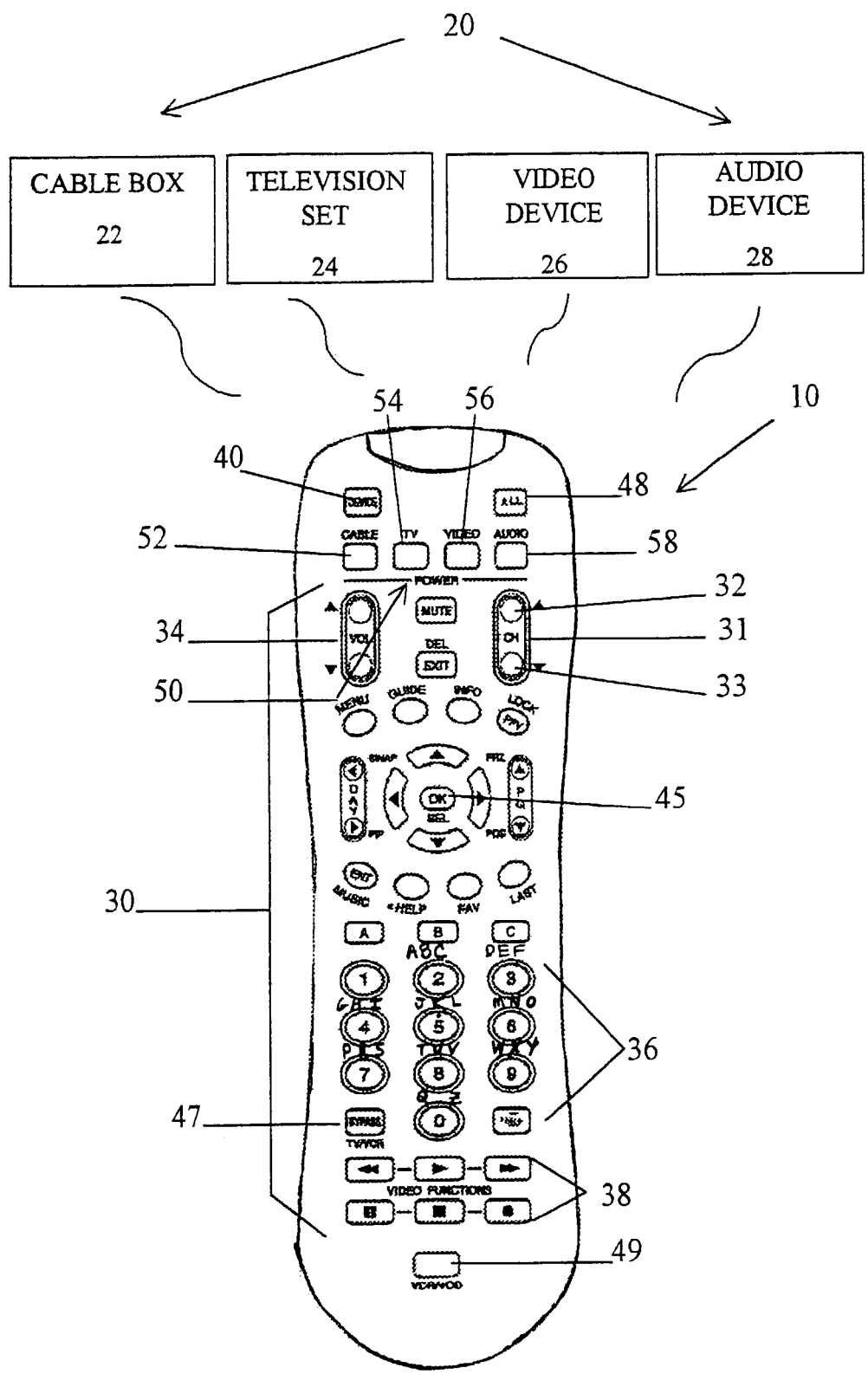
FIG. 1 is front plan view of a universal remote control unit according to the present invention.

Referring initially to FIG. 1, an exemplary universal remote control unit 10 in accordance with the invention for controlling a plurality of devices 20 is shown. As will be explained below, the universal remote control unit is configured to be programmed so that it controls a plurality of audio/visual devices without requiring, during programming by the user, entry of each category of device to be controlled. This simplifies the programming of the remote control unit for the user.

Examples of the plurality of devices 20 which may be controlled by the universal remote control unit 10 include a cable set-top box or converter 22, a television set 24, a video device 26 such as a videocassette recorder (VCR), a digital video disk (DVD) player, a personal video recorder (PVR), a laser-disk (LD) player, a computer, and an audio device 28 such as an amplifier, surround sound audio system, a digital music converter, or an audio-video receiver.

Universal remote control unit 10 includes an input device (means) 12 (FIG. 2) which may include a keyboard 30 having buttons/keys for enabling a user to select a plurality of functions in connection with the operation of the devices 20. As shown in FIG. 1, keyboard 30 may include a CHANNEL button 32, a VOLUME button 34, a plurality of numbered buttons 36, and a plurality of video function buttons 38.

In addition, input device 12 (FIG. 2) may also include a DEVICE button 40 for initiating a mode change (explained in more detail below), a SELECT button 45, a bypass button 47, an ALL (power) button 48, a VCR/VOD (video on demand) button 49, and a plurality of power/mode buttons 50 such as a CABLE button 52, a TV button 54, a VIDEO button 56, and an AUDIO button 58 for turning the corresponding device on/off and/or placing universal remote control unit 10 in one of a plurality of operating modes. For example, universal remote control unit 10 in its cable mode operates the functions of the cable box 22. In the television mode, the universal remote control unit operates the functions of the television 24. Preferably, each of the plurality of mode push buttons are illuminated by, for example, a light-emitting diode as known in the art.

Figure 2:
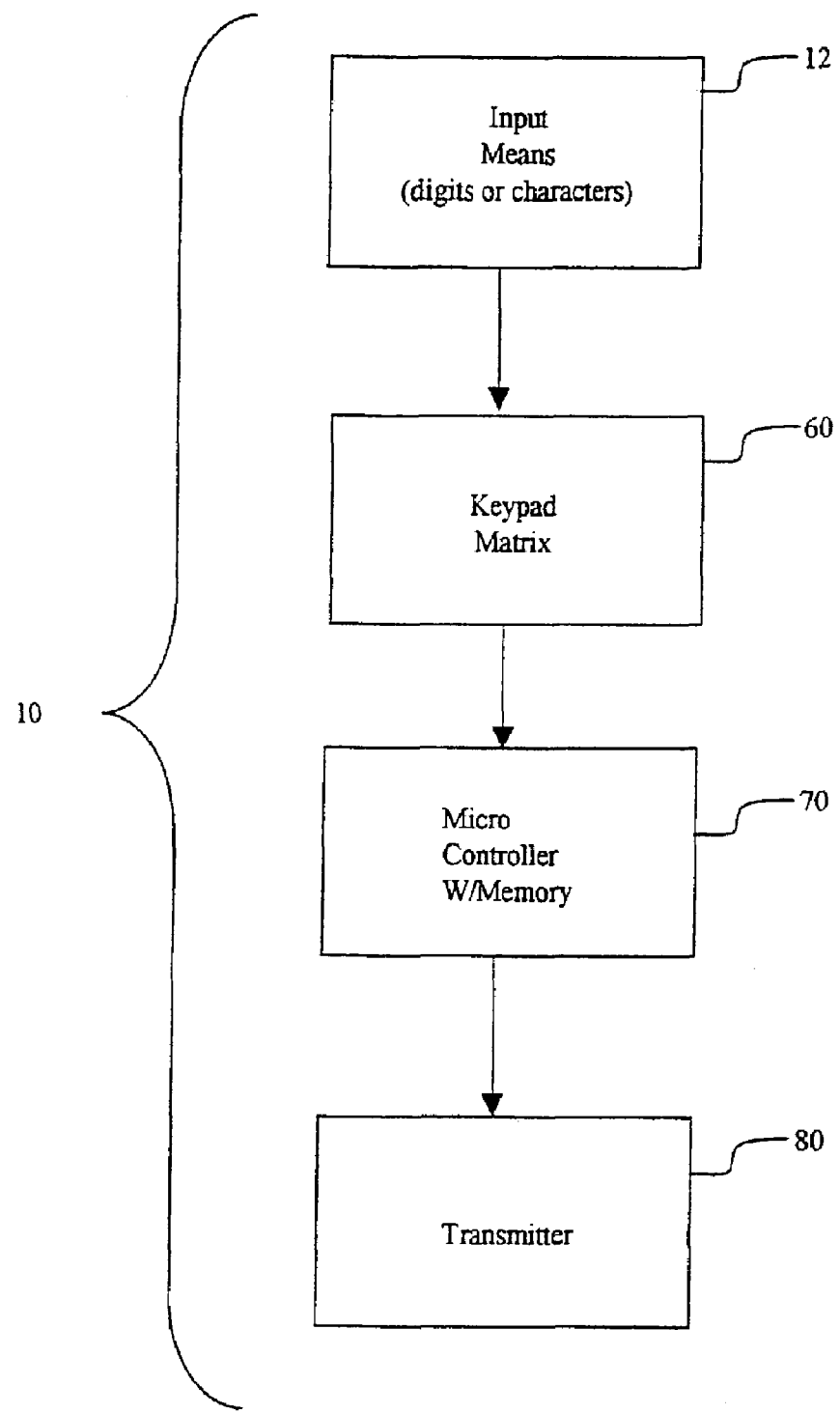
FIG. 2 is a block diagram of some of the components of the universal remote control unit shown in FIG. 1.

With reference to FIG. 2, universal remote control unit 10 includes, in addition to input means 12, a keypad matrix 60 capable of handling both character or numeric key presses, a microcontroller 70 which has resident memory for storing, among other things, a plurality of signal formatting data and user inputs, and a transmitter 80. During use of the remote control unit to control a particular one of the plurality of devices, and as known in the art, a user first typically selects the type of device to be controlled by activating one of the mode buttons. Thereafter, activation (for example, depression) of one or more of the plurality of buttons of keyboard 30 (FIG. 1) generates a command signal. This command signal is supplied to microcontroller 70. In response thereto, microcontroller 70 retrieves an appropriate control code (which may include the signal formatting data) from its associated memory based on prior programming of the unit by the user. Microcontroller 70 then causes transmitter 80 to generate a signal in accordance with the control code retrieved from memory. The signal is received by a corresponding one of the devices 20 (FIG. 1) thereby causing the corresponding device, e.g., cable box 22, television 24, video device 26, or audio device 28, to have the desired response.

Preferably, microcontroller 67 is a programmable infrared (IR) low-voltage micro-controller device such as Part No. GMS344XXXT from LG (Goldstar) Semicon Co., Ltd. of Korea. The processor is run by application software or programming, (e.g., assembly language) and is typically governed by the manufacturer's protocol.

The present invention is not limited to such a processing environment. The present invention can be incorporated and used within many types of processing environments. From the following description, computer readable program code means for use in microcontroller 70 and for implementing the present invention may be readily programmed by those skilled in the art and stored in the microcontroller's memory.

The microcontroller memory may include a ROM (read-only-memory) and a RAM (random access memory). It is foreseen that the universal remote control unit could include an additional memory, separate from the microcontroller memory, having ROM and/or RAM portions. As explained in more detail below, the ROM portion of the memory stores a plurality of signal formatting data which identifies for the microcontroller 70 the configuration of the signal for each device 20 so that when a signal is generated and transmitted, it is recognized by the corresponding device.

Referring to FIG. 3, an exemplary signal formatting data entry (or record) for controlling a television set 24 is shown. The signal formatting data entry includes a number of segments, some of which are informational (e.g., record length, manufacturer name, and device type), and others of which identify the signal configuration which is necessary to obtain a desired response from the television. The signal configuration portions of the signal formatting data include the protocol type, power on, power off, channel entry, channel up, channel down, volume up, volume down, and mute, among others. The signal formatting data need not be stored in the memory in a particular order. That is, the entries need not be stored in groups by manufacturer, category of device, or year of manufacture. Other signal formatting data entries will include signal configuration portions which are specific to the type of device. For example, a signal formatting data entry for a VCR will include, in addition to power on and power off, signal configurations for play, stop, pause, rewind, fast forward, etc.

During programming of the universal remote control unit 10, the user identifies the manufacturer of each device to be controlled by the remote control unit 20. Thereafter, the user inputs the name of the manufacturer (or a portion thereof, for example, the first three letters) of a first device via numbered buttons 36 (FIG. 1). The numbered buttons have associated therewith letter designations similar to those of a traditional telephone touchpad. In the preferred embodiment, the user spells the manufacturer's name or a portion thereof using the keypad. Once the name of the manufacturer has been confirmed as corresponding to the name of a manufacturer stored in memory, in one embodiment a list of the signal formatting data entries stored in the memory which relate to the particular manufacturer is displayed, for example, on the television or an LCD screen of the remote control unit. The list provides numerical codes which are utilized to derive an address of the ROM of the remote control unit which has stored therein signal formatting data for the manufacturer. The user preferably inputs a first of the numerical codes in the remote control unit via numbered buttons 36. As explained below, if it is determined that the numerical code entered by the user is a valid code and operates the device to be controlled (as explained in more detail below), the corresponding ROM address is stored in the RAM portion of the memory. Alternatively, the valid code which is associated with the ROM address can be stored. If the first numerical code entered by the user is not a valid code or does not operate the device to be controlled, the user enters a second numerical code from the list until a code which operates the device is identified.

Once a signal formatting data entry is identified which controls the device, the remote control unit determines from the signal formatting data the category of the device associated with the code entered by the user. In particular, the signal formatting data entry includes a portion which identifies the category of device (device type, e.g., television, VCR, cable set-top box, etc.). Upon determination of the device type, the ROM address which corresponds to the numerical code entered by the user is stored at the appropriate memory location for that particular type of device. Subsequently, when the remote control unit is set to operate that particular type of device, by e.g. actuation of the mode key for that type of device, and/or upon actuation of buttons/keys on the remote control unit which are uniquely associated with the particular type of device, even without actuation of the mode key, the appropriate signal formatting data will be accessed from the ROM to transmit an appropriate signal to the desired device.

Figure 4A:
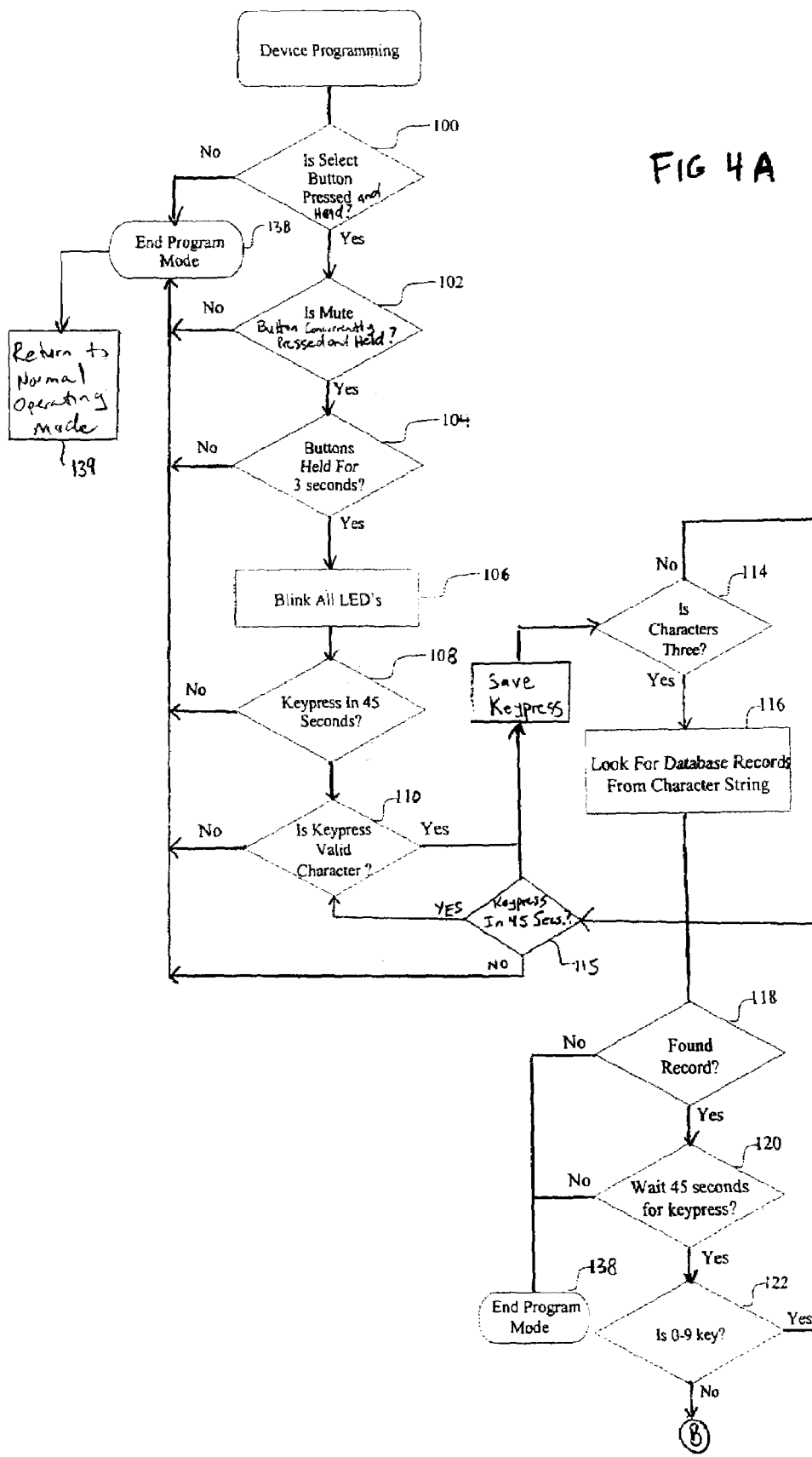
FIG. 4A is a flow chart for programming the remote control unit shown in FIG. 1 to operate a specific device.

Referring now to FIG. 4A, a first method of programming a universal remote control unit to operate a plurality of devices, whether or not manufactured by different manufacturers, without identifying the category of device which is being controlled, will be described.

In order to program the universal remote control device, the user must first enter a programming mode of operation. The programming mode of operation is entered in the illustrated embodiment, when the user concurrently actuates the select and mute bottons for at least three seconds. While the select and mute buttons are utilized in the illustrated embodiment, it is foreseen that a single button or other multiple buttons could be activated to enter the programming mode.

Referring specifically to FIG. 4A, a determination is made as to whether the select button on the remote control unit is pressed and held (Step 100). If the select button has not been pressed and held (NO in Step 100), the programming mode will not be entered (Step 138) and the remote control unit will return to the normal operating mode (Step 139). However, if the select button has been pressed and held (YES in Step 100), then a determination is made as to whether the mute button has been concurrently pressed and held with the mute button (Step 102). If the select and mute buttons have not been concurrently pressed and held (NO in Step 102), then the programming mode is not entered (Step 138) and the remote control unit returns to the normal operating mode (Step 139). If the mute button has been concurrently pressed and held (YES in Step 102), then a determination is made as to whether the select and mute buttons have been concurrently actuated for a predetermined period of time, for example, three seconds (Step 104). If the select and mute buttons have not been concurrently actuated for the predetermined period of time (NO in Step 104), then the programming mode is not entered (Step 138) and the remote control unit returns to the normal operating mode (Step 139). If the select and mute buttons have been concurrently held for the predetermined period of time (YES in Step 104), then, in the illustrative embodiment, the light emitting diodes (LED) on the remote control device which correspond to the CABLE button 52, TV button 54, VIDEO button 56 and AUDIO button 58 blink (Step 106) for a period of time, for example, 45 seconds.

After blinking of the CABLE, TV, VIDEO and AUDIO buttons, a determination is made as to whether a key is actuated on the remote control unit within a predetermined period of time, e.g., 45 seconds (Step 108). If a key press on the remote control unit does not occur within the predetermined period of time (NO in Step 108), then the programming mode ends (Step 138) and the remote control unit returns to the normal operating mode (Step 139). If a key press does occur within the predetermined period of time (YES in Step 108), then a determination is made as to whether the actuated key was one of the numerical keys 36 and therefore a valid entry (Step 110). As mentioned above, the numerical keys 36 have characters (letters) located above keys zero and 2–9 similar to the character/number assignments used for telephone keypads. The numerical key presses should correspond to the letters of the name of the manufacturer of the device to be controlled.

If the key that was actuated is not a numerical key 36 which has letters associated therewith (that is, not zero or 2–9) (NO in Step 110), then the programming mode ends (Step 138) and the remote control unit returns to the normal operating mode (Step 139). However, if the actuated key is a numerical key (that is, the key is zero or 2–9) (YES in Step 110), then the key entry in Step 108 is stored in memory (Step 112), and a determination is made as to whether three numerical key presses have been made (Step 114).

If three numerical key presses have not been entered (NO in Step 114), then a determination is made as to whether a next key press is received within 45 seconds (Step 115). If a key press is not made within 45 seconds (NO in Step 115), the programming ends (Step 138) and the remote control unit returns to the normal operating mode (Step 139). If a key press is made within 45 seconds (YES in Step 115), the next numerical key press is monitored (Step 110) and temporarily stored in memory (Step 112). Upon recognition of three numerical key press entries which correspond to the keys zero or 2–9 (YES in Step 114), a determination is made as to whether the three key press entries correspond to the name of a manufacturer of a device to be programmed (valid entry) (Step 116) who has a signal formatting data entry stored in the remote control device. In the preferred embodiment a valid entry is determined by checking all of the signal formatting data entries to determine if the three key presses correspond to the first three letters of at least one manufacturer identified in the stored entries. If it is, the entry is valid. Otherwise, the entry is invalid.

If the three numerical key presses do not correspond to the name of a manufacturer (not a valid entry) (NO in Step 118), then the programming mode ends (Step 138) and the remote control unit returns to the normal operating mode (Step 139). However, if the three numerical key press entries do correspond to the name of a manufacturer (it is a valid entry) (YES in Step 118), then in one embodiment the programming mode continues by displaying (for example, on the television screen or LCD of the remote control unit) the associated codes for the database records which have the corresponding manufacturer code. The universal remote control unit then waits for another key press from the user to determine whether the user would like to use the "auto-scan" mode or the "direct entry" mode (explained below). If a key press is not made within a predetermined period of time (for example, 45 seconds) after the determination of a valid entry has been made (NO in Step 120), then the programming mode ends (Step 138).

However, if a key press is made within the predetermined period of time after a valid entry has been determined (YES in Step 120), then a determination is made as to whether the key press is one of the numerical keys on the numerical keypad 36 (Step 122). If the key press is a numerical key (YES in Step 122), then the programming mode continues with the direct entry method. If the key press is not one of the numerical keys 36 (NO in Step 122), then a determination is made as to whether a specific key was actuated which controls operation of the devices 20 (for example, volume, power, channel buttons) (Step 124). If the key press is a key which does control a specific function of the devices 20 (YES in Step 124), then the method of programming continues with the auto-scan mode. If the key press is not a key which controls a function of operation of the devices 20 (NO in Step 124), then the programming mode ends (Step 138) and the remote control unit returns to the normal operating mode (Step 139).

The direct entry method involves, in one embodiment, viewing an associated display screen to determine which signal data formatting entries associated with the particular manufacturer are stored in memory. The user will select and enter one of the displayed codes to see if the code has associated therewith signal formatting data which controls the particular device for this manufacturer. In the code-entry method this is performed on a trial and error basis.

Figure 4B:
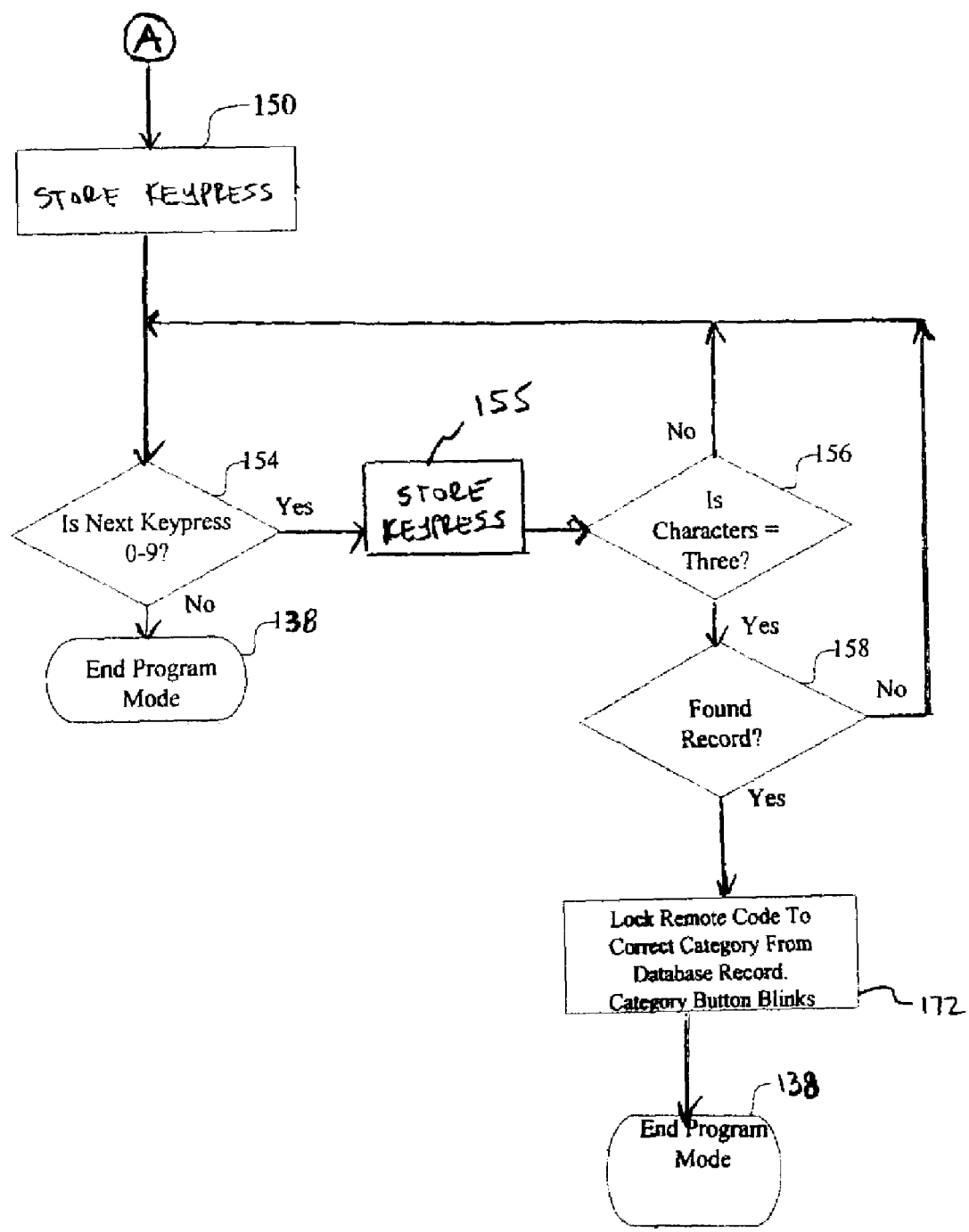
FIG. 4B is a continuation of the method of FIG. 4A showing the code-entry mode.

Referring now to FIG. 4B, if the key press entered in step 122 is a numerical key press (YES in Step 122), then the first key press is stored in memory (Step 150) and a determination is made as to whether the next key press is a numerical key press (Step 154). If the next key press is not a numerical key press (NO in Step 154), then the programming mode ends (Step 138) and the remote control unit returns to the normal operating mode (Step 139). If the next key press is a numerical key press (YES in Step 154), then the key press entry is stored in memory (Step 155) and a determination is made as to whether there have been three numerical key presses made (Step 156). If three numerical key presses have not been made (NO in Step 156), then the method returns to Step 154 to monitor for the next key press. If the next key press entry is a numerical key press (YES in Step 154), then the key press entry is stored in memory (Step 155) and a determination is made as to whether three key presses have occurred (Step 156). If three numerical key presses have occurred (YES in Step 156), then a determination is made as to whether a valid (at least one) signal formatting data entry (record) corresponding to the three numerical key presses (manufacturer name) has been found (Step 158). If a record is not found (NO in Step 158), then the method returns to Step 154 to monitor for a new numerical key press. If the next key press is not a numerical key press (NO in Step 154), then the method ends (Step 138) and the remote control unit returns to the normal operating mode (Step 139). If the next key press at Step 154 is a numerical key press (YES in Step 154), then a new (next) code is built based upon the user entries and the signal formatting data entries are examined as explained above. A valid (at least one) signal formatting data entry is determined by deriving the memory address corresponding to the entered numerical code and determining whether it is an address of a valid signal formatting data entry. If a signal formatting data entry is found, the code is valid. Otherwise, the code is invalid.

If the three numerical key presses do not correspond to a valid code (NO in Step 158), then the remote control device monitors for another key press (Step 154). However, if the three numerical key press entries do correspond to a valid code (YES in Step 158), then the memory address which corresponds to the three digit numerical code is saved in the memory at the memory location corresponding to the category of device (e.g., cable box, video, TV) listed in the specific device formatting data entry (Step 172). The corresponding mode button will preferably blink indicating that the programming for the device is complete. The programming mode then ends (Step 138).

In order to program the remote to operate a different device, the programming mode must be initiated again by actuating and concurrently holding the select and mute buttons (Steps 100, 102, 104).

Figure 5:
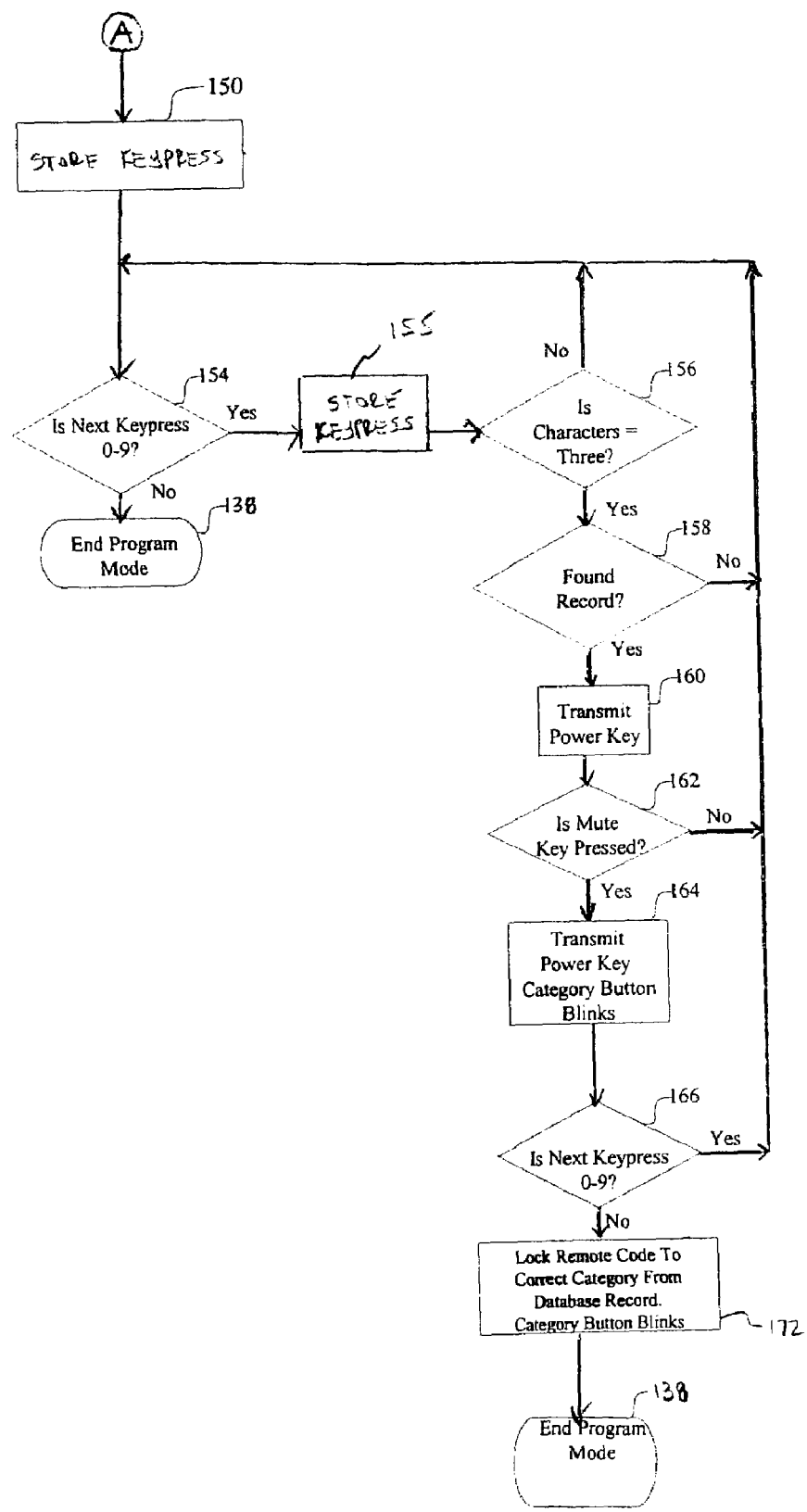
FIG. 5 is a flow chart of an alternative embodiment of the method of programming the remote control unit shown in FIG. 4B.

Referring now to FIG. 5, an alternative embodiment of the present invention described in connection with FIG. 4B is shown. In the alternative embodiment, the method of programming is similar to that described in connection with FIGS. 4A and 4B. However, after determining whether the code is valid (a record is found) in Step 158 (FIG. 5B), the alternative embodiment includes a method for confirming that the valid code corresponds to the memory address of a signal formatting data entry which properly controls the device by transmitting a sample signal from the remote control unit to the corresponding device to be controlled. If the device is responsive to the sample signal transmitted by the remote control unit, this confirms for the user that the numerical code that was entered is not only valid (corresponds to a memory location wherein signal formatting data is stored) but properly operates the device to be controlled.

If the three numerical key press entries do correspond to a valid code (YES in Step 158), then the signal formatting data stored in memory at the address location which corresponds to the valid code is accessed. The signal formatting data is tested to ensure that this information can be used to generate signals which operate the device to be controlled.

Specifically, in this alternative embodiment, the portion of the signal formatting data corresponding to the power (on/off) function of the device is accessed from the memory. A power on/off signal is generated and transmitted to the corresponding device (Step 160). Thereafter, if the power (on/off) setting of the corresponding device has been switched (i.e., the power for the device was on and is now off, or the power for the device was off and is now on), the user is instructed to press a key (e.g., the mute key) to indicate that the corresponding device has responded to the signal transmitted by the remote control device. If the user has actuated the mute key (YES in Step 162), then another signal is generated using the signal formatting data corresponding to the power (on/off) function of the device to return the device to its previous power (on/off) state (Step 164). In addition, in this alternative embodiment, the mode button (e.g., CABLE button 52, TV button 54, VIDEO button 56 and AUDIO button 58) corresponding to the specific signal formatting data preferably blinks once. If the mute button was not pressed (NO in Step 162), the process proceeds to Step 166.

The method next determines whether a key on the numerical keypad has been actuated (Step 166) within a predetermined period of time (e.g., 5 seconds). If a key on the numerical keypad has been actuated (YES in Step 166) within the predetermined period of time, this indicates that the signal formatting data accessed from the memory may not properly correspond to the selected device (i.e., the user did not observe the device turning on/off), and the user is re-entering the code or inputting another code to access the signal formatting data stored in the memory (Steps 154, 155 and 156).

If after Step 164 a next key press is not a numerical key press (NO in Step 166) within the predetermined period of time, then the memory address which corresponds to the three digit numerical code that was entered by the user is saved in the memory (Step 172) at the memory location corresponding to the category of device (e.g., cable box, video, TV) associated with the specific device formatting data entry. The corresponding mode button (e.g. TV, cable, video) will preferably blink three times to indicate that the programming for the device is complete. The programming mode then ends (Step 128).

Figure 6:
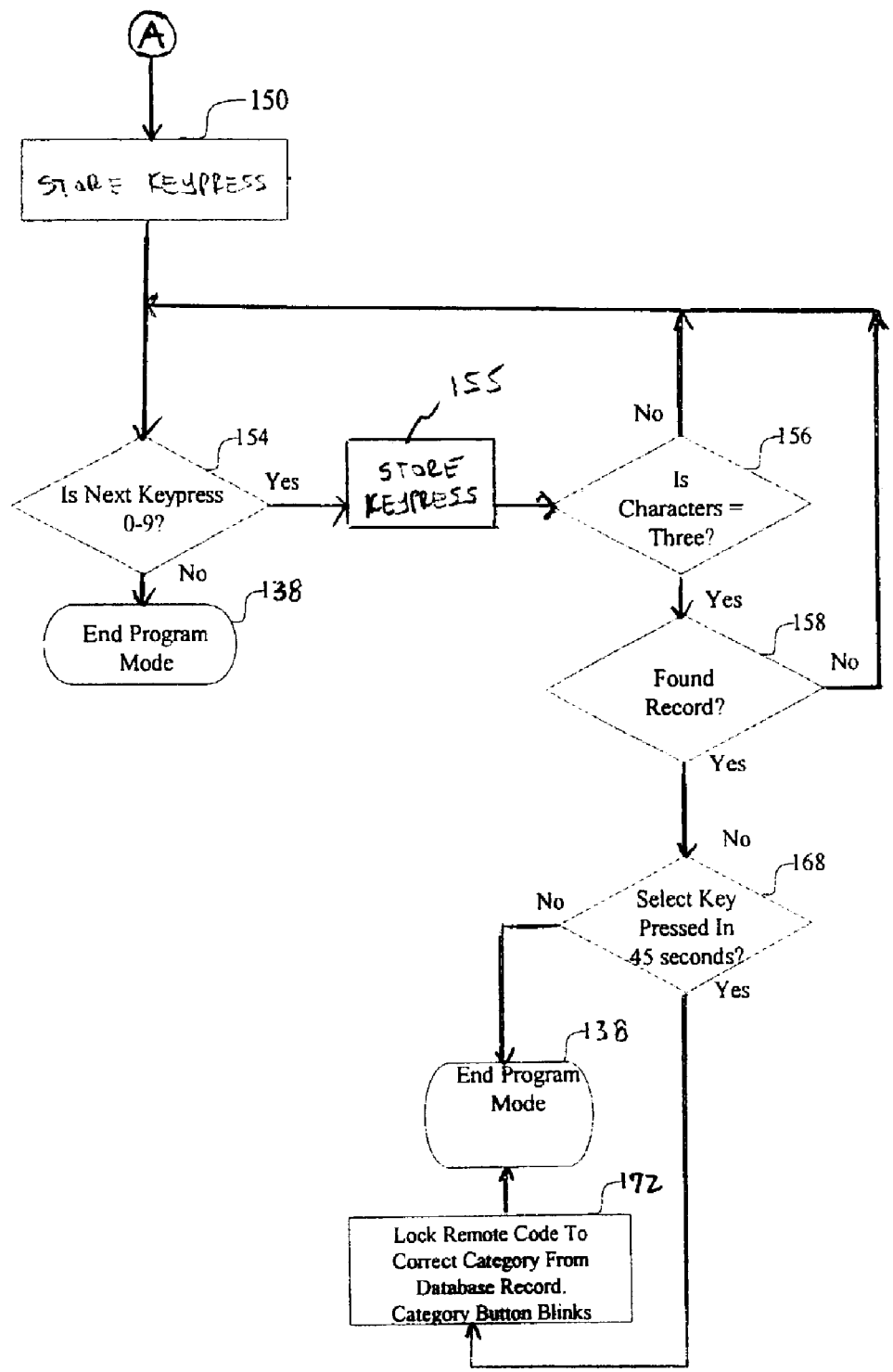
FIG. 6 is a flow chart of an alternative embodiment of the method of programming the remote control unit shown in FIG. 4B.

Referring now to FIG. 6 another alternative embodiment of the method of programming a universal remote control unit is shown. In this alternative embodiment, the method of programming is similar to that described above in connection with FIGS. 4A and 4B. However, after determining whether the numerical code entered by the user is valid in Step 158 (FIG. 6), in this alternative embodiment if the numerical code entered by the user is valid (YES in Step 158), a determination is made as to whether the select key is actuated within a predetermined period of time, e.g., 45 seconds (Step 168). If the select key is not actuated within the predetermined period of time (NO in Step 168), the programming mode ends (Step 138) and the memory address which corresponds to the numerical code entered by the user is not stored in memory. However, if the select key is actuated within the predetermined period of time (YES in Step 168), the memory address which corresponds to the three digit numerical code is saved in the memory at the memory location which corresponds to the category of device (e.g., cable box, video, TV) associated with the specific signal device formatting data. The corresponding mode button will preferably blink indicating that the programming for the device is complete (Step 172). The programming mode then ends (Step 138).

Figure 7:
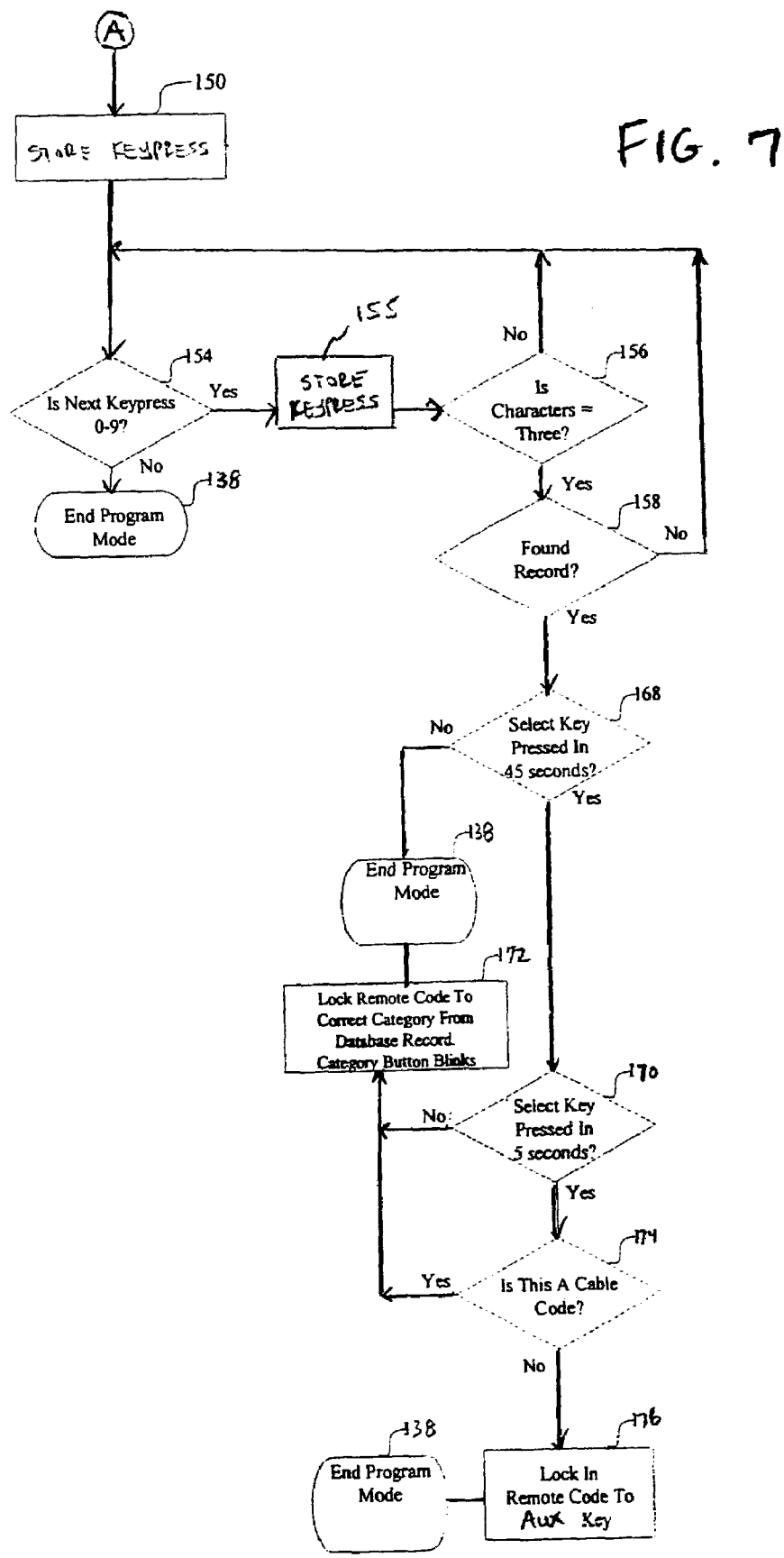
FIG. 7 is a flow chart of an alternative embodiment of the method of programming the remote control unit shown in FIG. 4B to operate a specific device.

Referring now to FIG. 7, an alternative embodiment of the method in connection with FIG. 6 is shown. In this alternative embodiment, after actuation of the select button in Step 168 (YES in Step 168), a determination is made as to whether the select key is pressed again in a second predetermined period of time, e.g., five seconds (Step 170).

In this alternative embodiment, after the select key is actuated in Step 168, the user is advised, in, e.g. instructional materials provided with the remote control device, to press the select key again within five seconds if the user desires to link the device being programmed to an auxiliary key (not shown in FIG. 1). The user would press the select key a second time in Step 170 if, for example, two devices of the same general device type are to be controlled by the remote control unit. This might occur, for example, if separate VCR and DVD players are to be operated by the remote control unit. One of the devices would be linked to the video button and the other device would be linked to the auxiliary button. While four device power buttons are shown on the remote control unit of FIG. 1, it is foreseen that any number of power buttons could be included.

If the select key is not pressed within the second predetermined period time (NO in Step 170), then the memory address which corresponds to the three digit code that was entered by the user is saved in the memory at the memory location corresponding to the category of device (e.g., cable box, video, TV) associated with the specific signal formatting data. The corresponding mode button will preferably blink indicating that the programming for the device is complete (Step 172). The programming mode then ends (Step 138).

If the select key was actuated in the second predetermined period of time (YES in Step 170), then a determination is preferably made as to whether the signal formatting data that was accessed from the memory corresponds to the cable box (Step 174). This is determined by analyzing the portion of the signal formatting data which identifies the device type. If the signal formatting data does correspond to a cable box (YES in Step 174), the memory address which corresponds to the numerical code entered by the user is stored in the memory location corresponding to the cable box (Step 172). If, however, the signal formatting data does not correspond to a cable box (NO in Step 174), then the memory address which corresponds to the numerical code entered by the user is stored in the memory at a location corresponding to the auxiliary key (Step 176) and the programming mode ends (Step 138).

Figure 8:
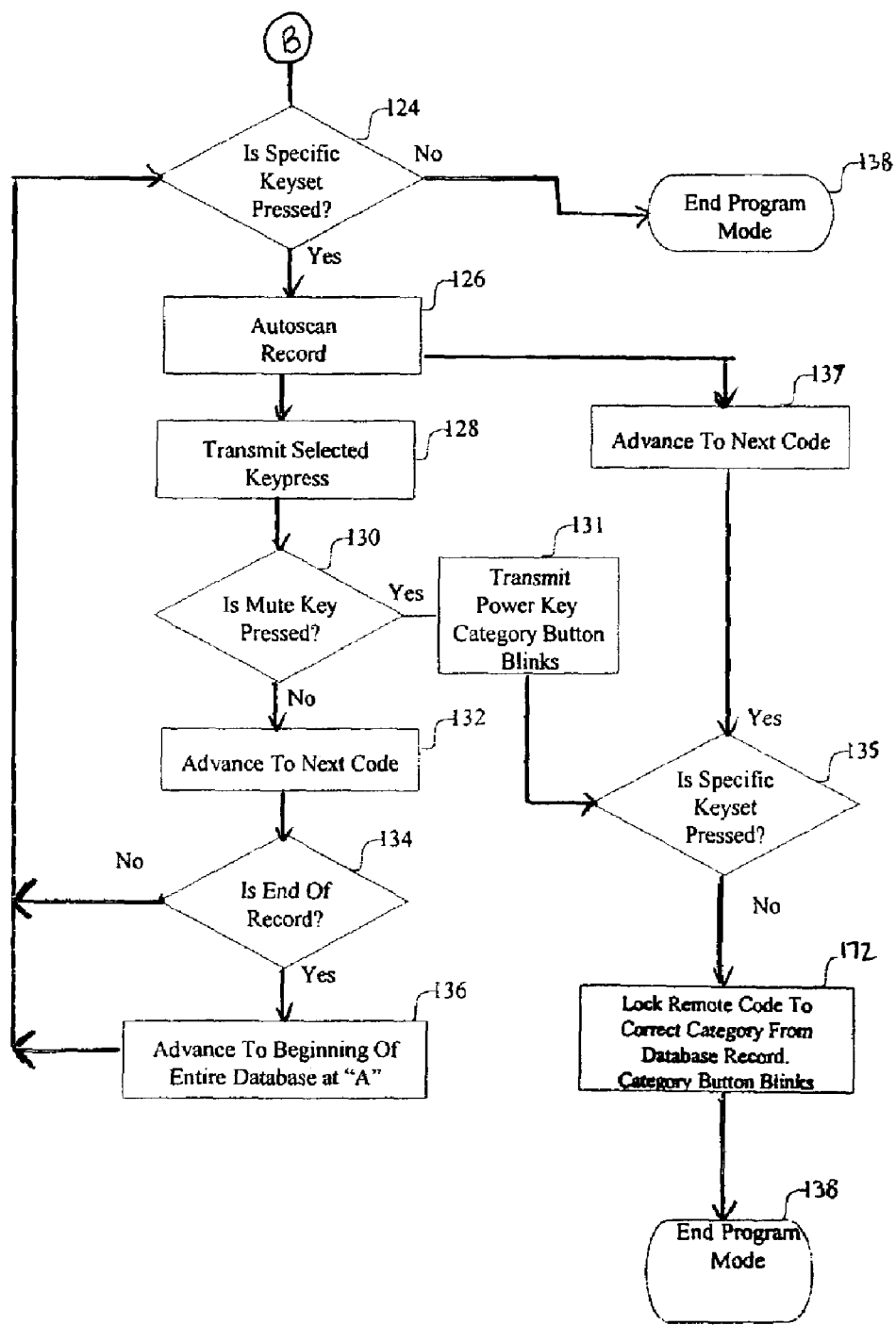
FIG. 8 is a flow chart for programming the remote control unit shown in FIG. 1 with the auto-scan mode.

Turning now to the auto-scan mode which differs from the direct entry mode, the universal remote control unit automatically tries each of the records corresponding to the particular manufacturer so that the user need not enter the memory location code. Referring now to FIG. 8 and returning to Step 124, if a key is pressed which controls one of the devices (for example, volume, channel, play, mute and power), then an auto-scan of all of the records stored in memory is conducted (Step 126) to locate all of the records which correspond to the particular manufacturer identified by the user in Steps 110–116. As with the direct-entry mode, this occurs by examining the data field of each record which stores the manufacturer name information to identify only those signal formatting data entries which include the specific manufacturer name in the corresponding data field. Thereafter, a specific control signal designated in Step 124 is transmitted using a first data record (Step 128) of the list of records identified as including the name of the manufacturer. Based on an observation from the user, the user will determine whether the selected control signal was responded to by the control device. If the user observes the device being responsive to the signal transmitted by the universal remote control, the user will press the mute key (Step 130). If the mute key is pressed by the user indicating that the device to be controlled is responsive (YES in Step 130), then the universal remote control transmits the power on/off command and the category buttons blink (Step 131). Thereafter, a determination is made as to whether another control key was pressed by the user (Step 135). If another control key is pressed by the user (YES in Step 135), this is indicative of the user's desire to program the remote control unit to control another device of the same manufacturer, and the method advances to Step 137 wherein the universal remote advances to the next code identified as corresponding to the manufacturer entered in Steps 110–116. The method then returns to Step 126 to begin the autoscan process again.

If the mute key is not pressed in Step 130 (NO in Step 130), this is indicative of the signal transmission not having controlled the device in Step 128. The universal remote advances to the next code corresponding to the signal formatting data entry of the particular manufacturer (Step 132). A determination is then made as to whether the list of entries for this particular manufacturer has been exhausted (Step 134). If the universal remote control unit has not reached the end of the list of records for the particular manufacturer (NO in Step 134), then the method returns to Step 128 wherein the selected key press is transmitted for the next code. If the end of the list of records for the particular manufacturer is reached (YES in Step 134), this is an indication that the codes stored in the remote control device for the particular manufacturer do not correspond to the code of the unit which is to be controlled. If the end of the list of records for the particular manufacturer has been reached (YES in Step 134), then the microcontroller returns to the beginning of the entire data base and each stored entry will be tested based on the selected control key indicated by the user in Step 124.

Returning to Step 135, if a specific control key is not pressed (NO in Step 135), then the memory address of the record which includes the signal formatting data that controls the specific device is saved in the memory at the memory location corresponding to the category of device associated with the specific formatting data (Step 172). The corresponding mode button will preferably blink indicating that the programming for the device is complete. The programming mode then ends (Step 138). In order to program the remote to operate a different device, the programming mode must be initiated again by actuating and concurrently holding the select and mute buttons (Steps 100, 102, 104).

Figure 9:
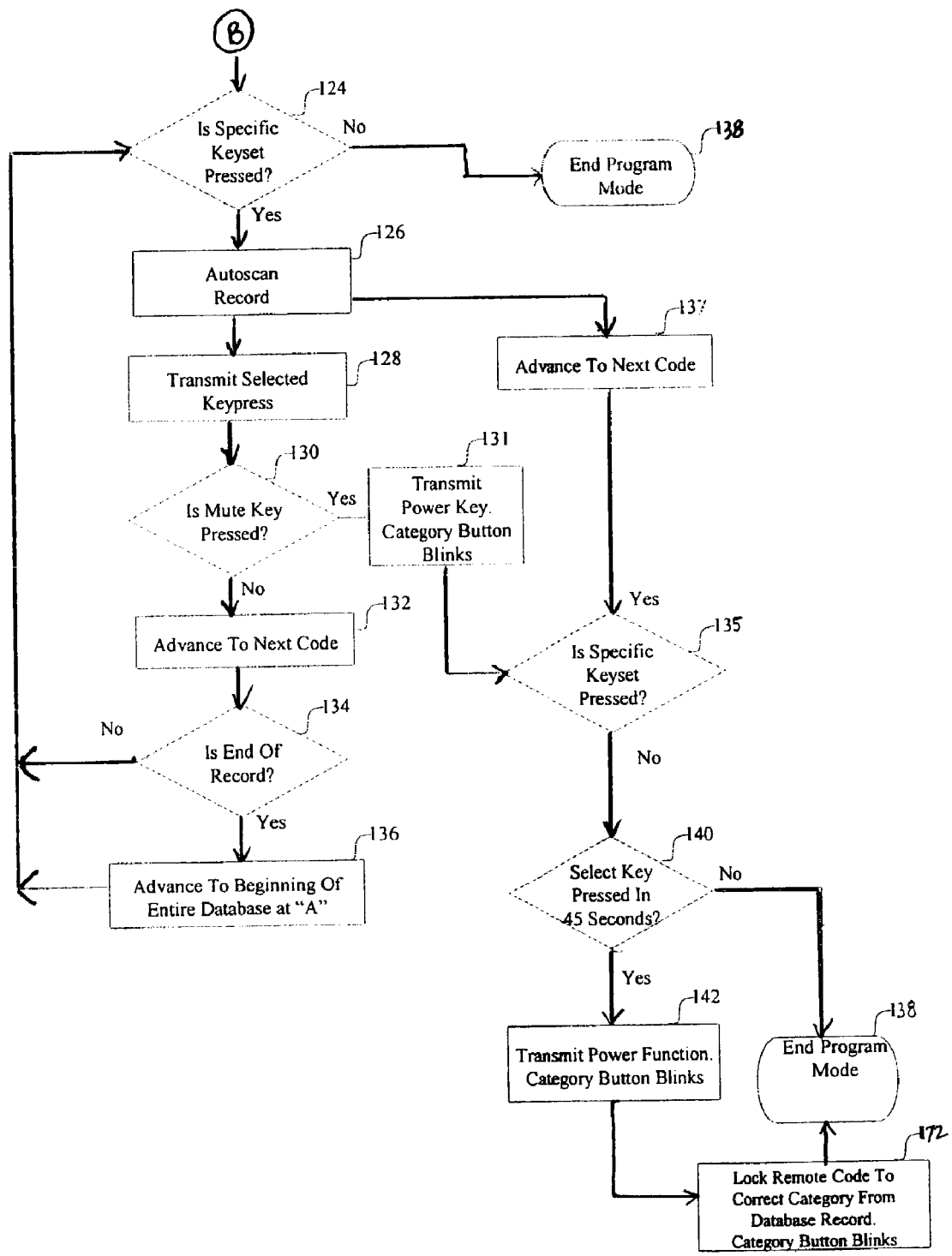
FIG. 9 is a flow chart of an alternative embodiment for programming the remote control unit with the auto-scan mode.

Referring now to FIGS. 9A and 9B an alternative embodiment of the method of programming a universal remote control unit in auto-scan mode is shown. In this alternative embodiment, the method of programming is similar to that described above in connection with FIGS. 8. However, after determining whether a specific key is pressed in Step 135, in this alternative embodiment if a specific key is actuated (YES in Step 135), a determination is made as to whether the select key is actuated within a predetermined period of time, e.g., 45 seconds (Step 140). If the select key is not actuated within the predetermined period of time (NO in Step 140), the programming mode ends (Step 138) and the memory address which corresponds to the numerical code entered by the user is not stored in memory. However, if the select key is actuated within the predetermined period of time (YES in Step 140), the power command for the device to be controlled is transmitted again to return the device to its prior state, the corresponding category button blinks (Step 142) and the memory address which corresponds to the specific device formatting data is saved in the memory at the memory location which corresponds to the category of device (e.g., cable box, video, TV) associated with the specific signal formatting data. The corresponding mode button will preferably blink indicating that the programming for the device is complete (Step 172). The programming mode then ends (Step 138).

Figure 10:
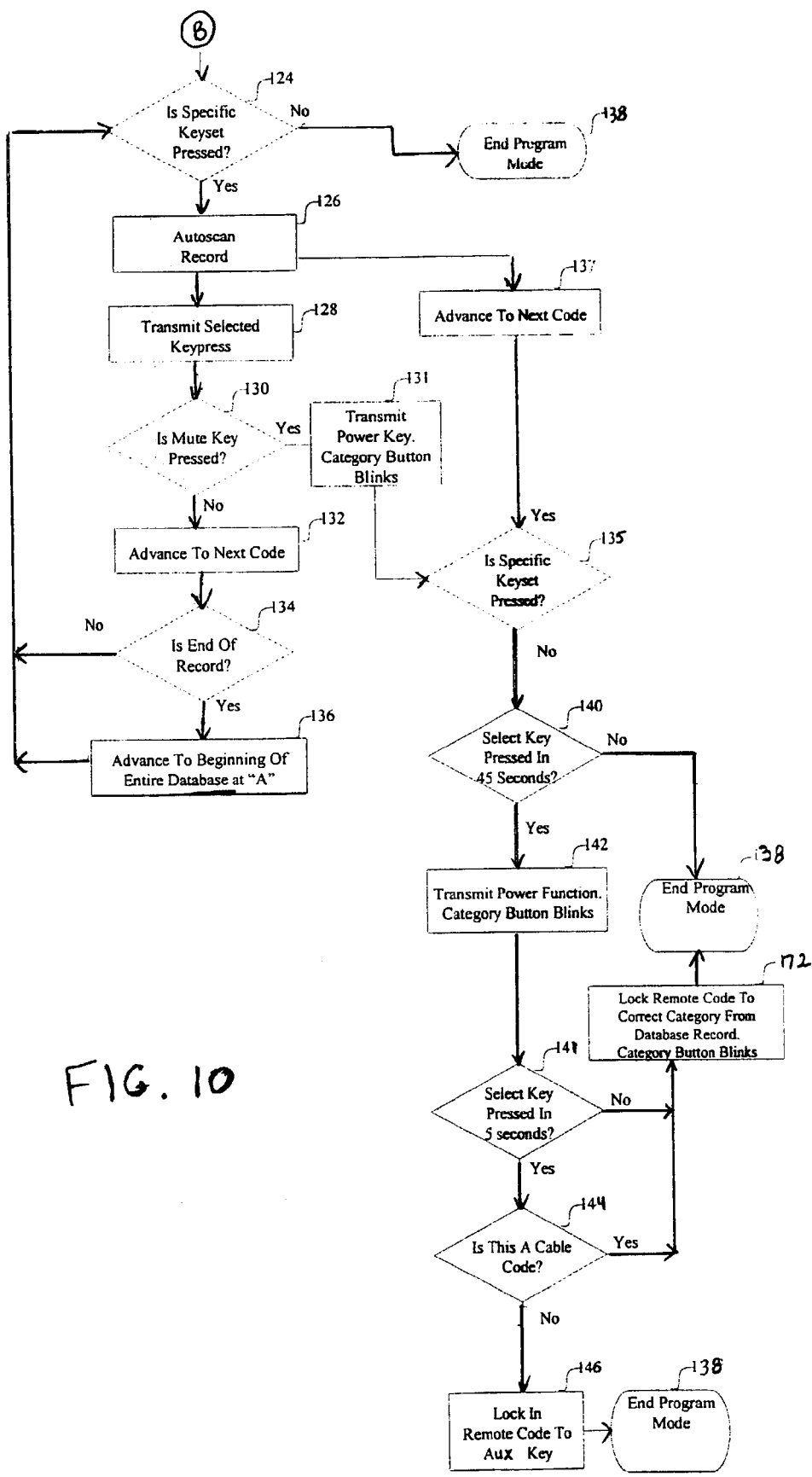
FIG. 10 is a flow chart of an alternate embodiment for programming a universal remote control unit with the auto-scan mode.

Referring now to FIG. 10, an alternative embodiment of the method in connection with FIGS. 9A and 9B is shown. In this alternative embodiment, after actuation of the select button in Step 140 (YES in Step 140) and transmission of the power function (Step 142), a determination is made as to whether the select key is pressed again in a second predetermined period of time, e.g., five seconds (Step 140).

In this alternative embodiment, after the select key is actuated in Step 140, the user is advised, in, e.g. instructional materials provided with the remote control device, to press the select key again within five seconds if the user desires to link the device being programmed to an auxiliary key. The user would press the select key a second time in Step 141 if, for example, two devices of the same general device type are to be controlled by the remote control unit. This might occur, for example, if separate VCR and DVD players are to be operated by the remote control unit. One of the devices would be linked to the video button and the other device would be linked to the auxiliary button. While four device power buttons are shown on the remote control unit of FIG. 1, it is foreseen that any number of power buttons could be included.

If the select key is not pressed within the second predetermined period time (NO in Step 141), then the memory address which corresponds to the three digit code that was entered by the user is saved in the memory at the memory location corresponding to the category of device (e.g., cable box, video, TV) associated with the specific device formatting data. The corresponding mode button will preferably blink indicating that the programming for the device is complete (Step 172). The programming mode then ends (Step 138).

If the select key was actuated in the second predetermined period of time (YES in Step 141), then a determination is preferably made as to whether the signal formatting data that was accessed from the memory corresponds to the cable box (Step 144). This is determined by analyzing the portion of the signal formatting data which identifies the type of device. If the signal formatting data does correspond to a cable box (YES in Step 144), the memory address which corresponds to the numerical code entered by the user is stored in the memory location corresponding to the cable box (Step 172). If, however, the signal formatting data does not correspond to a cable box (NO in Step 144), then the memory address which corresponds to the numerical code entered by the user is stored in the memory at a location corresponding to the auxiliary key (Step 146) and the programming mode ends (Step 138).

In order to program the remote to operate a different device after the programming mode ends (Step 138), the programming mode must be re-initiated by actuating and concurrently holding the select and mute buttons (Steps 100, 102, 104).

In yet another alternative embodiment of the present invention, the record for each signal formatting data stored in the universal remote control unit includes not only a manufacturer and device type which is the primary mode key with which the device is to be associated, but also an alternative device type which indicates a secondary mode key if the primary device type already has a device associated therewith (see FIG. 11).

From the present description, it will be appreciated by those skilled in the art that any type of input device, including but not limited to a touch screen or a liquid crystal display having a touch screen, may be used as an input means, instead of the push buttons, to enable a user to enter the numerical code. In addition, it will be appreciated by those skilled in the art that instead of illuminatable push buttons, one or more light-emitting diodes may be disposed on universal remote control unit to indicate the status of the programming. Further, it will be appreciated that instead of a cable mode key, a digital satellite system receiver key may be provided for controlling such a receiver. As well, a DVD button may be provided for controlling such a device and other buttons may be added to control other types of devices. Moreover, while the memory was described as including ROM and RAM portions, it is foreseen that the memory could include a programmable read-only memory (PROM), an erasable, programmable, read-only memory (EPROM), an electrically erasable, programmable read-only memory (EEPROM) or any other suitable memory configuration to achieve the desired results of the present invention.

Thus, while various embodiments of the present invention have been illustrated and described, it will be appreciated by those skilled in the art that changes and modifications may be made thereunto without departing from the spirit and scope of the invention.

What is claimed is:

1. A method of programming a universal remote control unit comprising the steps of:
    initiating, by a user, a programming mode;
    entering, by a user, characters corresponding to at least a portion of the name of a manufacturer of a device to be controlled by the remote control unit;
    identifying, from the characters, a signal formatting data entry, which includes signal formatting data, stored in a memory device in the remote control unit, which signal formatting data includes data determinative of a device type; and
    associating a device type in the remote control unit with the signal formatting data entry based upon the device type data, such that when one or more of a device type key associated with a device type is subsequently depressed, subsequent commands sent by the remote control unit have the format specified by the signal formatting data, and when a command key uniquely associated with the device type is depressed, commands sent by the remote control unit have the format specified by the signal formatting data.

2. The method of claim 1 further comprising the step of:
    generating a signal for transmission to the device to be controlled based on signal format information in the identified signal formatting data entry.

3. The method of claim 1 wherein the step of associating comprises:
    storing information regarding the identified signal formatting data entry in a memory location associated with the device type key.

4. The method of claim 1 wherein the step of associating comprises:
    generating and transmitting a signal to the device to be controlled based on signal format information in the identified signal formatting data entry; and
    storing information regarding the identified signal formatting data entry in a memory location associated with the device type key if the device responds to the transmitted signal.

5. The method of claim 1, wherein the device type is one of a cable set-top box, a television, a VCR, DVD, an audio component or a computer.

6. The method of claim 1, further comprising the step of:
    entering, by a user, a code associated with the manufacturer of the device to be controlled by the remote control unit.

7. The method of claim 6, further comprising the step of:
    identifying a code associated with the manufacturer of a device to be controlled by the remote control unit.

8. The method of claim 7, wherein, based upon the characters entered by the user, the universal remote control unit identifies codes associated with the manufacturer of the device to be controlled.

9. The method of claim 8, wherein the code associated with the manufacturer to be controlled by the remote control unit is entered by the user.

10. The method of claim 8, wherein the code associated with the manufacturer to be controlled by the remote control unit is identified by the universal remote control unit.

11. A method of programming a universal remote control unit comprising the steps of:
    initiating, by a user, a programming mode;
    entering, by a user, characters corresponding to at least a portion of the name of a manufacturer of a device to be controlled by the remote control unit;
    identifying, from the characters, a signal formatting data entry, which includes signal formatting data, stored in a memory device in the remote control unit, which signal formatting data includes data determinative of a device type; and
    associating a device type in the remote control unit with the signal formatting data entry based upon the device type data.

12. The method of claim 11 further comprising the step of:
    generating a signal for transmission to the device to be controlled based on signal format information in the identified signal formatting data entry.

13. The method of claim 11 wherein the step of associating comprises:
    storing information regarding the identified signal formatting data entry in a memory location associated with the device type.

14. The method of claim 11 wherein the step of associating comprises:
    generating and transmitting a signal to the device to be controlled based on signal format information in the identified signal formatting data entry; and
    storing information regarding the identified signal formatting data entry in a memory location associated with the device type if the device responds to the transmitted signal.

15. The method of claim 11, wherein the device type is one of a cable set-top box, a television, a VCR, DVD, an audio component or a computer.

16. The method of claim 11, further comprising the step of:
entering, by a user, a code associated with the manufacturer to be controlled by the remote control unit.

17. The method of claim 11, further comprising the step of:
identifying a code associated with the manufacturer to be controlled by the remote control unit.

18. The method of claim 17, wherein, based upon the characters entered by the user, the universal remote control unit identifies codes associated with the manufacturer of the device to be controlled.

19. The method of claim 18, wherein the code associated with the manufacturer to be controlled by the remote control unit is entered by the user.

20. The method of claim 18, wherein the code associated with the manufacturer to be controlled by the remote control unit is identified by the universal remote control unit.

21. A universal remote control unit for remotely controlling a plurality of devices, each having at least one of a plurality of types, comprising:
a memory;
a plurality of signal formatting data entries stored at respective locations in the memory, each entry comprising type information identifying a type of device, a manufacturer, and signal format information specifying signal formats of commands for controlling at least one of the plurality of devices of that type;
a transmitter;
input means; and
a processor capable of accessing the signal formatting data entries in the memory and capable of controlling the transmitter to transmit signals in conformance with the signal format information in the signal formatting data entries in response to actuation of the input means, wherein the input means enables a user to input at least one character in the name of the manufacturer to select the signal formatting data entries associated with the manufacturer.

22. The universal remote control unit according to claim 21, wherein the at least one character input by the user can be used to derive a memory location wherein the identified signal formmatting data entry is stored.

23. The universal remote control unit according to claim 21, wherein the memory further stores the at least one character input by the user.

24. The universal remote control unit according to claim 21, wherein the memory comprises a read only memory and a random access memory and the plurally of signal formatting data entries are stored in read only memory and at least one of the characters input by the user is stored in the random access memory.

* * * * *